(12) United States Patent
Konno et al.

(10) Patent No.: US 8,288,073 B2
(45) Date of Patent: Oct. 16, 2012

(54) PATTERN FORMING METHOD

(75) Inventors: Yousuke Konno, Tokyo (JP); Nakaatsu Yoshimura, Tokyo (JP); Fumihiro Toyokawa, Tokyo (JP); Hikaru Sugita, Tokyo (JP)

(73) Assignee: JSR Corporation, Tokyo (JP)

( * ) Notice: Subject to any disclaimer, the term of this patent is extended or adjusted under 35 U.S.C. 154(b) by 648 days.

(21) Appl. No.: 12/442,702

(22) PCT Filed: Sep. 18, 2007

(86) PCT No.: PCT/JP2007/068105
§ 371 (c)(1),
(2), (4) Date: Mar. 24, 2009

(87) PCT Pub. No.: WO2008/038544
PCT Pub. Date: Apr. 3, 2008

(65) Prior Publication Data
US 2010/0028802 A1      Feb. 4, 2010

(30) Foreign Application Priority Data

Sep. 28, 2006   (JP) ................................ 2006-265738

(51) Int. Cl.
G03F 7/00 (2006.01)
G03F 7/26 (2006.01)
G03F 7/40 (2006.01)

(52) U.S. Cl. ................. 430/270.1; 430/311; 430/273.1; 430/905; 430/917; 430/331; 430/271.1; 430/322

(58) Field of Classification Search ............... 430/270.1, 430/311, 273.1, 905, 917, 290, 271.1
See application file for complete search history.

(56) References Cited

U.S. PATENT DOCUMENTS

| | | | | |
|---|---|---|---|---|
| 5,561,026 A * | 10/1996 | Aoki | ............................. | 430/196 |
| 5,593,725 A * | 1/1997 | Park et al. | ....................... | 427/160 |
| 6,090,873 A * | 7/2000 | Okibe et al. | .................. | 524/265 |
| 6,777,161 B2 * | 8/2004 | Yasunami et al. | ......... | 430/270.1 |
| 7,064,060 B2 * | 6/2006 | Misawa et al. | ................. | 438/637 |
| 7,439,086 B2 * | 10/2008 | Yamazaki et al. | .............. | 438/30 |
| 7,629,051 B2 * | 12/2009 | Fukushige et al. | ............ | 428/421 |
| 7,648,820 B2 * | 1/2010 | Babich et al. | .................. | 430/313 |
| 7,790,843 B2 * | 9/2010 | Firestein-Miller | ............ | 530/300 |
| 7,820,465 B2 * | 10/2010 | Fujii | ............................... | 438/30 |
| 7,846,511 B2 * | 12/2010 | Fukushige et al. | ............ | 427/496 |
| 7,892,720 B2 * | 2/2011 | Eriguchi et al. | ............ | 430/270.1 |
| 7,964,452 B2 * | 6/2011 | Yamazaki et al. | ............. | 438/149 |
| 2005/0113472 A1 * | 5/2005 | Fillmore et al. | ................. | 521/50.5 |
| 2005/0191847 A1 * | 9/2005 | Misawa et al. | ................ | 438/624 |
| 2006/0115990 A1 | 6/2006 | Seino et al. | | |
| 2006/0223690 A1 * | 10/2006 | Mutoh | ............................. | 501/75 |
| 2006/0274423 A1 * | 12/2006 | Fukushige et al. | ............ | 359/659 |
| 2007/0072112 A1 * | 3/2007 | Prokopowicz et al. | .... | 430/270.1 |
| 2007/0148352 A1 * | 6/2007 | Oguri | ........................ | 427/255.36 |
| 2010/0021694 A1 * | 1/2010 | Wakizaka et al. | .............. | 428/172 |

FOREIGN PATENT DOCUMENTS

| | | |
|---|---|---|
| JP | 07-092684 | 4/1995 |
| JP | 2000-143937 | 5/2000 |
| JP | 2001-040293 | 2/2001 |
| JP | 2002-014474 | 1/2002 |
| JP | 2004-205676 | 7/2004 |
| JP | 2006-140222 | 6/2006 |

OTHER PUBLICATIONS

English language translation of JP 7-92684 (no date).*
Japanese Office Action for corresponding JP Application No. 2008-536338, Mar. 29, 2011.
Japanese Office Action for corresponding JP Application No. 2008-536338, Sep. 6, 2011.

* cited by examiner

*Primary Examiner* — Amanda C. Walke
(74) *Attorney, Agent, or Firm* — Ditthavong Mori & Steiner, P.C.

(57) ABSTRACT

This invention provides a method for resist under layer film formation, which can form a resist under layer film which can function as an anti-reflection film, is excellent in pattern transfer properties and etching resistance, and does not cause bending of a pattern even in the transfer of a fined pattern, and a composition for the resist under layer film for use in the method, and a method for pattern formation. The method for resist under layer film formation comprises the steps of coating a composition for resist under layer film formation (for example, a composition comprising a compound having a phenolic hydroxyl group, a solvent, and an accelerator) onto a substrate to be processed, and treating the formed coating film under an oxidizing atmosphere having an oxygen concentration of not less than 1% by volume and a temperature of 300° C. or higher to form a resist under layer film.

6 Claims, No Drawings

US 8,288,073 B2

PATTERN FORMING METHOD

FIELD OF THE INVENTION

The present invention relates to a method for forming a resist under layer film suitable for forming micro-patterns in a lithographic process using various types of radiation, particularly for producing an element of a highly integrated circuit, a composition for the resist under layer film, and a pattern forming method. In more detail, the present invention relates to a method for forming a resist under layer film which is capable of forming a resist under layer film functioning as an anti-reflection film and being excellent in pattern transfer properties and etching resistance and does not cause deformation of a pattern even in the transfer of a fined pattern, a composition for the resist under layer film for use in the method, and a method for pattern forming method.

BACKGROUND ART

In the process for producing an element of a highly integrated circuit, miniaturization of the working size using a multilayer resist process is progressing in order to achieve higher integration. In this process, a liquid composition for forming a resist under layer film is first coated onto a substrate and then a liquid photoresist composition is further coated thereon. Next, a mask pattern is transferred onto the photoresist film using a reduced projection exposure system (stepper), followed by development using an appropriate developer to obtain a photoresist pattern. After that, the pattern is transferred onto a resist under layer film by dry-etching. Finally, the resist under layer film pattern is transferred onto a substrate by dry-etching to obtain a substrate with a desired pattern. A multilayer process using one type of resist under layer film is called a bilayer resist process and a multilayer process using two types of resist under layer film is called a trilayer resist process.

A resist under layer film generally functions as an anti-reflection film which absorbs radiation reflected by a substrate. Additionally, a material having a large content of carbon atoms is used for a resist under layer film directly in contact with a substrate and exhibits good etching resistance during processing a substrate and ensures more accurate pattern transfer. A thermoset phenol novolac is a particularly well-known material for such a resist under layer film. Further, a composition containing a polymer possessing an acenaphthylene skeleton is known to have good characteristics as a resist under layer film (disclosed in, for example, Patent Documents 1 and 2).

[Patent Document 1] Japanese Unexamined Patent Application Publication No. JP-A 2000-143937

[Patent Document 2] Japanese Unexamined Patent Application Publication No. JP-A 2001-40293

DISCLOSURE OF THE INVENTION

[Problems that the Invention is to Solve]

However, along with the progress of further miniaturization of etching patterns, over-etching of a resist under layer film has become a serious problem. Improvement of accurate pattern transfer properties and etching resistance is desired. In particular, the properties of a resist under layer film not causing pattern deformation when the resist under layer film is processed as a photomask in the transfer of a fined pattern are desired.

The object of the present invention is to provide a method for forming a resist under layer film which is capable of forming a resist under layer film functioning as an anti-reflection film and being excellent in pattern transfer properties and etching resistance and does not cause deformation of a pattern even in the transfer of a fined pattern, a composition for the resist under layer film for use in the method, and a method for pattern forming method.

[Means for Solving the Problems]

The inventors made extensive study for solving the problem, and found that when a coating film obtained by a composition for a resist under layer film is deposited under an oxidizing atmosphere, a resist under layer film can be formed which is excellent in pattern transfer properties and etching resistance and does not cause deformation of a pattern even in the transfer of a fined pattern to complete the present invention.

The present invention is as follows.

[1] A method for forming a resist under layer film characterized by comprising a coating process in which a composition for forming a resist under layer film is coated on a substrate, and a film-forming process in which the coating film is subjected to setting under an oxidizing atmosphere with an oxygen content of 1% or more by volume and a temperature of 300° C. or higher to form a resist under layer film.

[2] The method for forming a resist under layer film according to [1] above, wherein the composition for forming a resist under layer film comprises a compound having a phenolic hydroxyl group and a solvent.

[3] The method for forming a resist under layer film according to [2] above, wherein the composition for forming a resist under layer film comprises at least one component selected from the group consisting of (a) a metal compound containing a metal element selected from the group consisting of elements of the groups 3 to 11 and elements of the groups 13 to 15 in the periodic table, (b) a peroxide, (c) a diazo compound, and (d) a halogen or a halogen acid, as an accelerator.

[4] The method for forming a resist under layer film according to [3] above, wherein the peroxide (b) in the accelerator comprises at least one peroxide selected from the group consisting of a peroxy acid, a diacyl peroxide, a peroxy acid ester, a ketal peroxide, a peroxydicarbonate, a dialkyl peroxide, a ketone peroxide and an alkyl hydroxy peroxide.

[5] The method for forming a resist under layer film according to [3] above, wherein the diazo compound (c) in the accelerator comprises 2,2'-azobisisobutylonitrile.

[6] The method for forming a resist under layer film according to [3] above, wherein the metal compound (a) in the accelerator comprises at least one metal compound which contains a metal element selected from the group consisting of cerium, lead, silver, manganese, osmium, ruthenium, vanadium, thallium, copper, iron, bismuth and nickel.

[7] The method for forming a resist under layer film according to [3] above, wherein the halogen or the halogen acid (d) in the accelerator comprises at least one halogen selected from the group consisting of chlorine, bromine and iodine, and at least one compound selected from the group consisting of a perhalogen acid, a halogen acid, a halous acid a hypohalous acid, and salts of these acids.

[8] A pattern forming method characterized by comprising:
(1) a process for forming a resist under layer film on a substrate by the method for forming a resist under layer film according to any one of above [1] to [7],
(2) a process for forming a resist film on the resist under layer film using a resist composition solution,
(3) a process for exposing necessary parts of the resist film to radiation, (4) a process for forming a resist pattern by developing an irradiated resist film, and
(5) a process for processing the resist under layer film and the substrate using the resist pattern as a mask by a dry-etching method.

[9] A composition for forming a resist under layer film characterized by comprising a compound having a phenolic hydroxyl group, a solvent and an accelerator, wherein the accelerator comprises at least one component selected from the group consisting of (a) a metal compound containing a metal element selected from the group consisting of elements of the groups 3 to 11 and elements of the groups 13 to 15 in the periodic table, (b) a peroxide, (c) a diazo compound, and (d) a halogen or a halogen acid.

[10] The composition for forming a resist under layer film according to [9] above, wherein the peroxide (b) in the accelerator comprises at least one peroxide selected from the group consisting of a peroxy acid, a diacyl peroxide, a peroxy acid ester, a ketal peroxide, a peroxydicarbonate, a dialkyl peroxide, a ketone peroxide and an alkyl hydroxy peroxide.

[11] The composition for forming a resist under layer film according to [9] above, wherein the diazo compound (c) in the accelerator comprises 2,2'-azobisisobutylonitrile.

[12] The composition for forming a resist under layer film according to [9] above, wherein the metal compound (a) in the accelerator comprises at least one metal compound which contains a metal element selected from the group consisting of cerium, lead, silver, manganese, osmium, ruthenium, vanadium, thallium, copper, iron, bismuth and nickel.

[13] The composition for forming a resist under layer film according to [9] above, wherein the halogen or the halogen acid (d) in the accelerator comprises at least one halogen selected from the group consisting of chlorine, bromine and iodine, and at least one compound selected from the group consisting of a perhalogen acid, a halogen acid, a halous acid a hypohalous acid, and salts of these acids.

[Effect of the Invention]

According to the method of forming a resist under layer film, a resist under layer film can be formed which is excellent in pattern transfer properties and etching resistance and does not cause deformation of a pattern even in the transfer of a fined pattern.

BEST MODE FOR CARRYING OUT THE INVENTION

Hereinafter, the embodiment of the present invention is described in detail.

[1] Method of Forming Resist Under Layer Film

The method for forming a resist under layer film of the present invention comprises a coating process in which a composition for forming a resist under layer film is coated on a substrate, and a film-forming process in which the coating film is subjected to setting under an oxidizing atmosphere with an oxygen content of 1% or more by volume and a temperature of 300° C. or higher to form a resist under layer film.

[1-1] Coating Process

In the above-mentioned coating process, a composition for forming a resist under layer film is coated on a substrate and a coating film is formed.

Examples of the substrate include a silicon wafer, a wafer covered with aluminum and the like.

In addition, the coating method for coating the composition for forming a resist under layer film onto the substrate is not particularly limited, but appropriate method such as rotation coating, cast coating and roll coating may be applied.

<Composition for Forming a Resist Under Layer Film>

As the above-mentioned composition for forming a resist under layer film, a liquid composition comprising a compound such as a resin (the compound may be a non-resinous compound) and a solvent that dissolves the compound is used.

(A) Compound

Examples of the above-mentioned compound include a compound having a phenolic hydroxyl group (hereinafter referred to also as "compound (A)") and the like.

Examples of the compound having a phenolic hydroxyl group include a novolac resin, a resole resin, polyvinylphenol, a derivative of polyvinylphenol, a calixarene-based compound, a derivative of a calixarene-based compound and the like. The compound (A) may be used singly or in combination of two or more types thereof.

Examples of the above-mentioned novolac resin include resins obtained by reacting at least one phenolic compound selected from the group consisting of a phenol such as phenol, cresol, xylenol, resorcinol, bisphenol A, p-tert-butyl phenol and p-octyl phenol, and a naphtol such as a-naphthol, β-naphthol, 1,5-dihydronaphthalene and 2,7-dihydronaphthalene with at least one aldehyde such as formaldehyde, paraformaldehyde, trioxane, furfuryl aldehyde, benzaldehyde and naphthoaldehyde, leading to an aldehyde source compound in the presence of an acidic catalyst, and the like.

In addition, specific examples of the above resole resin include a resin obtained by reacting the above phenolic compound with the above-mentioned aldehyde using an alkaline catalyst, and the like.

Examples of the above-mentioned polyvinylphenol and derivatives thereof include a polymer represented by the following general formula (1).

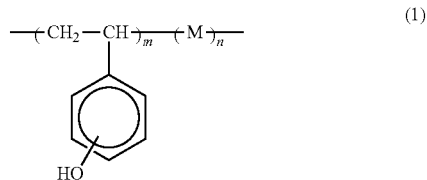

[In the general formula (1), M represents a radically polymerizable monomer, m is a positive integer, n is 0 or a positive integer, and m and n satisfy the relationship of $5 \leq m+n \leq 200$ and $m/(m+n) \geq 0.5$. The hydroxyl group may bond to any of para, ortho and meta positions.]

The radically polymerizable monomer M which is a copolymerizable component may be a compound having a polymerizable unsaturated group including a styrene-based monomer such as styrene and α-methyl styrene, (meth)acrylonitrile, an acryl-based monomer such as a (meth)acrylic acid, a (meth)acrylic acid ester including (meth)acrylic acid methyl ester, and acrylamide, a vinylether compound, maleic anhydride, vinyl pyridine and the like.

The amount of the radically polymerizable monomer M in the polymer is preferably less than 50% by mol.

These polyvinylphenol-based polymers are commercially available under the trademarks of "Maruka Lyncur M" (poly-p-vinylphenol), "Lyncur MB" (brominated poly-p-vinylphenol), "Lyncur CMM" (copolymer of p-vinylphenol and methyl methacrylate), "Lyncur CHM" (copolymer of p-vinylphenol and 2-hydroxyethyl methacrylate), and "Lyncur CST" (copolymer of p-vinylphenol and styrene), all manufactured by Maruzen Petrochemical Co., Ltd, and the like.

As examples of the above calixarene compound and its derivative, a polymer represented by the following general formula (2) can be given.

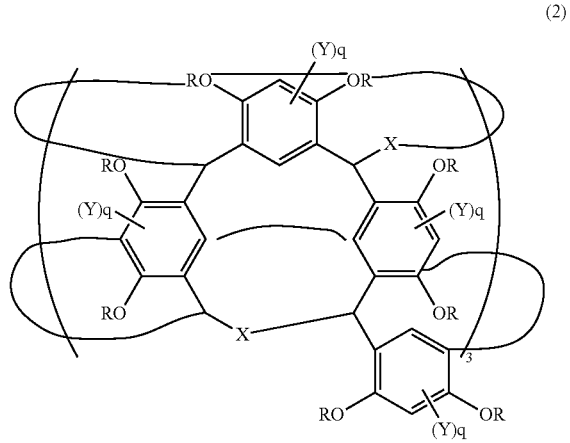

(2)

[In the general formula (2), R individually represents a hydrogen atom, a substituted or unsubstituted monovalent acid dissociable group having a chain structure, or a substituted or unsubstituted monovalent thermally decomposable group having a chain structure, provided that at least one of the Rs is a substituted or unsubstituted monovalent acid dissociable group having a chain structure; X individually represents a substituted or unsubstituted alkylene group having 1 to 8 carbon atoms; Y individually represents a substituted or unsubstituted alkyl group having 1 to 10 carbon atoms, a substituted or unsubstituted alkenyl group having 2 to 10 carbon atoms, a substituted or unsubstituted alkynyl group having 2 to 10 carbon atoms, a substituted or unsubstituted aralkyl group having 7 to 10 carbon atoms, a substituted or unsubstituted alkoxy group having 1 to 10 carbon atoms, or a substituted or unsubstituted phenoxy group; and q is individually 0 or 1.]

Specific examples of the compound of the above-mentioned general formula (2) include a compound obtained by a condensing reaction of at least one phenolic compound such as resorcinol, 2-methyl resorcinol and 2-butyl resolcinol, and at least one selected from a dialdehyde compound such as 1,5-pentanedial, 1,7-heptanedial, 1,9-nonandial and 1,10-decandial, and the like.

There are no specific limitations to the conditions (method) of the condensing reaction and a known method can be applied. For example, a method of reacting at a temperature in the range from 60° C. to 90° C. for 12 to 50 hours in the presence of an acid catalyst, and the like can be given.

There are no specific limitations to the acid-dissociable group and the thermally decomposable group so long as the groups are dissociable by an acid or decomposed by heat. Examples include tert-butoxy carbonyl group, methoxy methyl group, ethoxy methyl group, 1-methoxy ethyl group, 1-ethoxy ethyl group and the like.

In addition, the total amount of the acid-dissociable group and the thermally decomposable group is preferably in the range from 10% to 90% by mol based on 100% by mol of the total amount of R in the above-mentioned general formula (2). If the amount is less than 10% by mol, the solubility of the calixarene compound remarkably decreases and an under layer film with a desired film thickness may not be obtained.

(B) Solvent

The resist under layer film composition of the present invention contains a solvent capable of dissolving the above-mentioned compound (A) (hereinafter referred to as "solvent (B)") and is a normally liquid composition.

The solvent (B) is not particularly limited so long as being capable of dissolving the above compound (A) and example thereof includes an ethylene glycol monoalkyl ether such as ethylene glycol monomethyl ether, ethylene glycol monoethyl ether, ethylene glycol mono-n-propyl ether and ethylene glycol mono-n-butyl ether; an ethylene glycol monoalkyl ether acetate such as ethylene glycol monomethyl ether acetate, ethylene glycol monoethyl ether acetate, ethylene glycol mono-n-propyl ether acetate and ethylene glycol mono-n-butyl ether acetate; a diethylene glycol dialkyl ether such as diethylene glycol dimethyl ether, diethylene glycol diethyl ether, diethylene glycol di-n-propyl ether and diethylene glycol di-n-butyl ether; a triethylene glycol dialkyl ether such as triethylene glycol dimethyl ether and triethylene glycol diethyl ether;

a propylene glycol monoalkyl ether such as propylene glycol monomethyl ether propylene glycol, monoethyl ether, propylene glycol mono-n-propyl ether and propylene glycol mono-n-butyl ether; a propylene glycol dialkyl ether such as propylene glycol dimethyl ether, propylene glycol diethyl ether, propylene glycol di-n-propyl ether and propylene glycol di-n-butyl ether; a propylene glycol monoalkyl ether acetate such as propylene glycol monomethyl ether acetate, propylene glycol monoethyl ether acetate, propylene glycol mono-n-propyl ether acetate and propylene glycol mono-n-butyl ether acetate;

a lactic acid ester such as methyl lactate, ethyl lactate, n-propyl lactate, i-propyl lactate, n-butyl lactate and i-butyl lactate; an aliphatic carboxylate such as methyl formate, ethyl formate, n-propyl formate, i-propyl formate, n-butyl formate, i-butyl formate, n-amyl formate, i-amyl lactate, methyl acetate, ethyl acetate, n-propyl acetate, i-propyl acetate, n-butyl acetate, i-butyl acetate, n-amyl acetate, i-amyl acetate, n-hexyl acetate, methyl propionate, ethyl propionate, n-propyl propionate, i-propyl propionate, n-butyl propionate, i-butyl propionate, methyl butylate, ethyl butylate, n-propyl butylate, i-propyl butylate; n-butyl butylate and i-butyl butylate;

other ester such as ethyl hydroxyacetate, ethyl 2-hydroxy-2-methylpropionate, methyl 3-methoxy-2-methyl propionate, methyl 2-hydroxy-3-methyl butyrate, ethylmethoxy acetate, ethylethoxy acetate, methyl 3-methoxy propionate, ethyl 3-ethoxy propionate, ethyl 3-methoxy propionate, 3-methoxypropyl acetate, 3-methoxybutyl acetate, 3-methyl-3-methoxybutyl acetate, 3-methyl-3-methoxybutyl propionate, 3-methyl-3-methoxybutyl butyrate, methyl acetoacetate, methyl pyruvate and ethyl pyruvate; an aromatic hydrocarbon such as toluene and xylene; a ketone such as methyl ethyl ketone methyl n-propyl ketone, methyl n-butyl ketone, 2-heptanone, 3-heptanone, 4-heptanone and cyclohexanone; an amide such as N-methyl formamide, N,N-dimethl formamide, N-methyl acetoamide, N,N-dimethyl acetoamide and N-methyl pyrrolidone; a lactone such as y-butyrolactone; and the like.

Among the solvent (B), propylene glycol monomethyl ether, propylene glycol monoethyl ether acetate, ethyl lactate, n-butyl acetate, ethyl 3-ethoxy propionate, methyl 3-methoxy propionate, 2-heptanone, cyclohexanone, y-butyrolactone and the like are preferred. The solvent (B) may be used singly or in combination of two or more types thereof.

The solvent (B) is used usually in an amount required to make the solid content of the resist under layer film composition a range usually from 5% to 80% by weight, preferably from 5% to 40% by weight, and further preferably from 10% to 30% by weight.

The composition for forming a resist under layer film of the present invention may optionally contain an accelerator (C), an acid generator (D), and a crosslinking agent (E) as well as various other additives (F) such as a binder resin, a radiation absorbent and a surfactant to an extent that does not damage the desired effect of the present invention. The addition of the accelerator (C) is particularly preferable.

(C) Accelerator

The above-mentioned accelerator (C) is an adjuvant which can accelerate a dehydrogenation reaction in the later-described film-forming process. Specific example includes a one-electron oxidant and the like.

The one-electron oxidant refers to an oxidant which receives one electron itself. For example, in the case of cerium (IV) ammonium nitrate, cerium ion (IV) receives one electron and changes itself into cerium ion (III). Additionally, a radical oxidant such as halogen is converted into an anion by acquiring one electron. The phenomenon of oxidizing a compound by taking one electron from the compound (substrate, catalyst, etc.) is called one-electron oxidation and the compound which receives the one electron is called a one-electron oxidant.

Typical examples of the above-mentioned one-electron oxidant include (a) a metal compound, (b) a peroxide, (c) a diazo compound, (d) a halogen or halogen acid, and the like.

Examples of the above-mentioned metal compound (a) include a metal compound containing a metal element selected from the group consisting of elements of the groups 3 to 11 (formerly groups IIIA, IVA, VA, VIA, VIIA, VIII, and IB (transition elements)) and elements of groups 13 to 15 (formerly groups IIIB, IVB, and VB) in the periodic table, and the like. That is, a metal compound containing an element selected from cerium, lead, silver, manganese, osmium, ruthenium, vanadium, thallium, copper, iron, bismuth and nickel. Specific examples include (a1) a cerium salt (including tetravalent cerium salt) such as cerium (IV) ammonium nitrate (CAN; cerium (IV) ammonium hexanitrate), cerium (IV) acetate, cerium (IV) nitrate and cerium (IV) sulfate; (a2) a lead compound (including tetravalent lead compound) such as lead tetraacetate and lead (IV) oxide, (a3) a silver compound such as silver oxide (I), silver oxide (II), silver carbonate (Fetizon reagent) and silver nitrate; (a4) a manganese compound such as permanganate, active manganese dioxide and manganese (III) salt, (a5) an osmium compound such as osmium tetroxide, (a6) a ruthenium compound such as ruthenium troxide, (a7) a vanadium compound such as $VOCl_3$, $VOF_3$, $V_2O_5$, $NH_4VO_3$ and $NaVO_3$, (a8) a thallium compound such as thallium (III) acetate, thallium (III) trifluoroacetate and thallium (III) nitrate; (a9) a copper compound such as copper (II) acetate, copper (II) trifluoromethanesulfonate, copper (II) trifluoroborate, copper(II) chloride and copper (I) acetate; (a10) an iron compound such as iron (III) chloride and potassium hexacyanoferrate (III), (a11) a bismuth compound such as sodium bismuthate, (a12) a nickel compound such as nickel peroxide, and the like. The compound may be used singly or in combination of two or more types thereof.

Examples of the above-mentioned peroxide (b) include a peroxy acid such as peracetic acid and m-chloroperbenzoic acid; hydrogen peroxide; a hydroxyperoxide such as t-butyl hydroperoxide; a diacyl peroxide, a peroxy acid ester, a ketal peroxide, peroxydicarbonate, a dialkyl peroxide, a ketone peroxide and the like. The compound may be used singly or in combination of two or more types thereof.

Examples of the above-mentioned diazo compound (c) include 2,2'-azobisisobutyronitrile and the like. The compound may be used singly or in combination of two or more types thereof.

Examples of the above-mentioned halogen or halogen acid (d) include a halogen such as chlorine, bromine and iodine; a perhalogen acid, a halogen acid, a halous acid and a hypohalous acid of chlorine, bromine and iodine, as well as salts thereof and the like. Specific examples of the salt of halogen acid include sodium perchlorate, sodium bromate and the like. The compound may be used singly or in combination of two or more types thereof.

Among the above-mentioned mono-electron oxidizers, a peroxide (b) and a diazo compound (c) are preferable, and m-chloroperbenzoic acid, t-butyl hydroperoxide, and 2,2'-azobisisobutyronitrile are particularly preferable. These mono-electron oxidizers are preferable because there is no possibility that these oxidizers would cause metal residues to attach to a substrate.

The composition for forming a resist under layer film of the present invention may comprise two or more types of the above-mentioned accelerator (C). In particular, the composition may be one containing two or more one-electron oxidizers selected from the above-mentioned metal compound (a) and the peroxide (b).

The compounding amount of the above-mentioned accelerator (C) is usually not more than 1,000 parts by weight, preferably in the range from 0.01 to 500 parts by weight, and further preferably from 0.1 to 100 parts by weigh based on 100 parts by weight of the compound (A).

(D) Acid Generator

The composition for forming a resist under layer film of the present invention may contain an acid generator (hereinafter referred to as "acid generator (D)") to an extent that does not damage the desired effect of the present invention.

The acid generator (C) is a component which generates an acid by radiation or heat. Examples of the acid generator which generates an acid by radiation (hereinafter referred to as "photoacid generator") include an onium salt-based photoacid generator such as diphenyliodonium trifluoromethane sulfonate, diphenyliodonium nonafluoro-n-butane sulfonate, diphenyliodonium pyrene sulfonate, diphenyliodonium n-dodecylbenzene sulfonate, diphenyliodonium 10-camphor sulfonate, diphenyliodonium naphthalene sulfonate, diphenyliodonium hexafluoroantimonate, bis(4-t-butylphenyl)iodonium trifluoromethane sulfonate, bis(4-t-butylphenyl)iodonium nonafluoro-n-butane sulfonate, bis(4-t-butylphenyl) iodonium n-dodecylbenzene sulfonate, bis(4-t-butylphenyl) iodonium 10-camphor sulfonate, bis(4-t-butylphenyl) iodonium naphthalene sulfonate, bis(4-t-butylphenyl) iodonium hexafluoroantimonate, triphenylsulfonium trifluoromethane sulfonate, triphenylsulfonium nonafluoro-n-butane sulfonate, triphenylsulfonium n-dodecylbenzene sulfonate, triphenylsulfonium naphthalene sulfonate, triphenylsulfonium 10-camphor sulfonate, triphenylsulfonium hexafluoroantimonate, 4-hydroxyphenyl-phenyl-methylsulfonium p-toluene sulfonate, 4-hydroxyphenyl-benzyl-methylsulfonium p-toluene sulfonate, cyclohexyl-methyl-2-oxocyclohexylsulfonium trifluoromethane sulfonate, 2-oxocyclohexyl dicyclohexylsulfonium trifluoromethane sulfonate, 2-oxocyclohexyl dimethylsulfonium trifluoromethane sulfonate, 1-naphthyldimethylsulfonium trifluoromethane sulfonate, 1-naphthyldiethylsulfonium trifluoromethane sulfonate, 4-cyano-1-naphthyldimethylsulfonium trifluoromethane sulfonate, 4-cyano-1-naphthyldiethylsulfonium trifluoromethane sulfonate, 4-nitro-1-naphtyldimethylsulfonium trifluoromethane sulfonate, 4-nitro-1-naphtyldiethylsulfonium trifluoromethane sulfonate, 4-methyl-1-naphtyldimethylsulfonium trifluoromethane sulfonate, 4-methyl-1-naphtyldiethylsulfonium trifluoromethane sulfonate, 4-hydroxy-1-naphtyldimethylsulfonium trifluoromethane sulfonate, 4-hydroxy-1-naphtyldiethylsulfonium trifluoromethane sulfonate, 1-(4-hydroxynaphthalen-1-yl)tetrahydrothiophenium trifluoromethane sulfonate, 1-(4-methoxynaphthalen-1-yl)tetrahydrothiophenium trifluoromethane sulfonate, 1-(4-ethoxynaphthalen-1-yl)tetrahydrothiophenium trifluoromethane sulfonate, 1-(4-methoxymethoxynaphthalen-1-yl)tetrahydrothiophenium trifluoromethane sulfonate, 1-(4-ethoxymethoxynaphthalen-1-yl)tetrahydrothiophenium trifluoromethane sulfonate, 1-[4-(l-methoxyethoxy)naphthalen-1-yl]tetrahydrothiophenium trifluoromethane sulfonate, 1-[4-(2-methoxyethoxy)naphthalen-1-yl]tetrahydrothiophenium trifluoromethane sulfonate, 1-(4-methoxycarbonyloxynaphthalen-1-yl)tetrahydrothiophenium trifluoromethane sulfonate, 1-(4-ethoxycarbonyloxynaphthalen-1-yl)tetrahydrothiophenium trifluoromethane sulfonate, 1-(4-n-propoxycarbonyloxynaphthalen-1-yl)tetrahydrothiophenium trifluoromethane sulfonate,
1-(4-i-propoxycarbonyloxynaphthalen-1-yl)tetrahydrothiophenium trifluoromethane sulfonate, 1-(4-n-butoxycarbonyloxynaphthalen-1-yl)tetrahydrothiopheniumtrifluoromethane sulfonate, 1-(4-t-butoxycarbonyloxynaphthalen-1-yl)tetrahydrothiophenium trifluoromethane sulfonate, 1-[4-(2-tetrahydrofuranyloxy)naphthalen-1-yl]tetrahydrothiophenium trifluoromethane sulfonate, 1-[4-(2-tetrahydropyranyloxy)naphthalen-1-yl]tetrahydrothiophenium trifluoromethane sulfonate, 1-(4-benzyloxy)tetrahydrothiophenium trifluoromethane sulfonate, and 1-(naphthylacetomethyl)tetrahydrothiophenium trifluoromethanesulfonate;

a halogen-containing compound-based photoacid generator such as phenyl bis(trichloromethyl)-s-triazine, 4-methoxyphenyl bis(trichloromethyl)-s-triazine, and 1-naphthyl bis(trichloromethyl)-s-triazine; a diazoketone compound-based photoacid generator such as 1,2-naphthoquinone diazido-4-sulfonylchloride, 1,2-naphthoquinone diazido-5-sulfonylchloride, 1,2-naphthoquinone diazido-4-sulfonate or 1,2-naphthoquinone diazido-5-sulfonate of 2,3,4,4'-tetrahydroxybenzophenone; a sulfone compound-based photoacid generator such as 4-trisphenacylsulfone, mesitylphenacylsulfone and bis(phenylsulfonyl)methane; a sulfonic acid compound-based photoacid generator such as benzointosylate, tris(trifluoromethanesulfonate) of pyrogallol, nitrobenzyl-9,10-diethoxyanthracene-2-sulfonate, trifluoromethanesulfonyl bicyclo[2,2,1]hept-5-en-2,3-dicarbodimide, N-hydroxysuccinimide trifluoromethane sulfonate, and 1,8-naphthalenedicarboxylate imide trifluoromethane sulfonate; and the like.

Among the photacid generator, diphenyliodonium trifluoromethane sulfonate, diphenyliodonium nonafluoro-n-butane sulfonate, diphenyliodonium pyrene sulfonate, diphenyliodonium n-dodecylbenzene sulfonate, diphenyliodonium 10-camphor sulfonate, diphenyliodonium naphthalene sulfonate, bis(4-t-butylphenyl)iodonium trifluoromethane sulfonate, bis(4-t-butylphenyl)iodonium nonafluoro-n-butane sulfonate, (4-t-butylphenyl)iodonium n-dodecylbenzene sulfonate, (4-t-butylphenyl)iodonium 10-camphor sulfonate, (4-t-butylphenyl)iodonium naphthalene sulfonate and the like are preferred. The photacid generator may be used singly or in combination of two or more types thereof.

Examples of the acid generator generating an acid when heated (hereinafter referred to as "thermal acid generator") include 2,4,4,6-tetrabromocyclohexadienone, benzoin tosylate, 2-nitrobenzyl tosylate, an alkyl sulfonate and the like. The thermal acid generator may be used singly or in combination of two or more types thereof.

A photoacid generator and a thermal acid generator may be used in combination as the acid generator (D).

The compounding amount of the acid generator (D) is usually not more than 5,000 parts by weight, preferably in the range from 0.1 to 1,000 parts by weight, and further preferably from 0.1 to 100 parts by weight based on 100 parts by weight of the compound (A).

In the case where the composition for forming a resist under layer film of the present invention contain a photoacid and/or a thermal acid generator, a crosslinking reaction can be carried out effectively between the molecular chains of polymers at a comparatively low temperature (including room temperature).

(E) Crosslinking Agent

The composition for forming a resist under layer film of the present invention may optionally contain a crosslinking agent (hereinafter, referred to as "crosslinking agent (E)" to an extent that does not damage the desired effect of the present invention. The crosslinking agent (E) is a component effective for preventing intermixing between the resulting resist under layer film and a resist film produced thereon and also preventing cracks in the resist under layer film.

As the crosslinking agent, a polynuclear phenol and various commercially available hardening agents may be used.

Examples of the above-mentioned polynuclear phenol include a binuclear phenol such as 4,4'-biphenyldiol, 4,4'-methylenebisphenol, 4,4'-ethylidenebisphenol and bisphenol A; a trinuclear phenol such as 4,4',4"-methylidenetrisphenol and 4,4'-[1-{4-(1-[4-hydroxyphenyl]-1-methylethyl)phenyl}ethylidene]bisphenol; a polyphenol such as novolac; and the like. Among these, 4,4'-[1-{4-(1-[4-hydroxyphenyl]-1-methylethyl)phenyl}ethylidene]bisphenol, novolac and the like are preferable. The polynuclear phenol may be used singly or in combination of two or more types thereof.

Examples of the hardening agent include a diisocyanate such as 2,3-tolylene diisocyanate, 2,4-tolylene diisocyanate, 3,4-tolylene diisocyanate, 3,5-tolylene diisocyanate, 4,4'-diphenylmethane diisocyanate, hexamethylene diisocyanate and 1,4-cyclohexane diisocyanate; and commercially available products such as an epoxy compound including "Epikote 812", "Epikote 815", "Epikote 826", "Epikote 828", "Epikote 834", "Epikote 836", "Epikote 871", "Epikote 1001", "Epikote 1004", "Epikote 1007", "Epikote 1009" and "Epikote 1031" (manufactured by Japan Epoxy Resins Co., Ltd.), "Araldite 6600", "Araldite 6700", "Araldite 6800", "Araldite 502", "Araldite 6071", "Araldite 6084", "Araldite 6097" and "Araldite 6099" (manufactured by Ciba Specialty Chemicals K.K.), "DER331", "DER332", "DER333", "DER661", "DER644" and "DER667" (manufactured by Dow Chemical Company) and the like; a melamine-type hardening agent including "Cymel 300", "Cymel 301", "Cymel 303", "Cymel 350", "Cymel 370", "Cymel 771", "Cymel 325", "Cymel 327", "Cymel 703", "Cymel 712", "Cymel 701", "Cymel 272" and "Cymel 202", "Mycoat 506" and "Mycoat 508" (manufactured by Mitsui Cyanamid); a benzoguanamine-type hardening agent including "Cymel 1123", "Cymel 1123-10", "Cymel 1128", "Mycoat 102", "Mycoat 105", "Mycoat 106" and "Mycoat 130" (manufactured by Mitsui Cyanamid); a glycoluril-type hardening agent including "Cymel 1170" and "Cymel 1172" (manufactured by Mitsui Cytec, Ltd.) and "NIKALAC N-2702" (manufactured by Sanwa Chemical Co., Ltd.); and the like. Among these, a melamine-type hardening agent, a glycoluril-type hardening agent and the like are preferable. The hardening agent may be used singly or in combination of two or more types thereof. Additionally, a polynuclear phenol and a hardening agent may be used in combination as the crosslinking agent (E).

The compounding amount of the crosslinking agent (E) is usually not more than 5,000 parts by weight, preferably in the range from 1 to 1,000 parts by weight, and further preferably from 1 to 20 parts by weight based on 100 parts by weight of the compound (A).

(F) Additives

The composition for forming a resist under layer film of the present invention may optionally contain various additives such as a binder resin, a radiation absorbent, and a surfactant to an extent that does not damage the desired effect of the present invention.

As the binder resin, various thermoplastic resins and thermoset resins may be used. The above-mentioned thermoplastic resin has an effect of providing the under layer film with flowability, mechanical properties and the like of the thermoplastic resin added to the composition.

Examples of the thermoplastic resin include, an a-olefin polymer such as polyethylene, polypropylene, poly-1-butene, poly-1-pentene, poly-1-hexene, poly-1-heptene, poly-1-octene, poly-1-decene, poly-1-dodecene, poly-1-tetradecene, poly-1-hexadecene, poly-1-octadecene and poly vinyl cycloalkane; a non-conjugated diene polymer such as poly-1,4-pentadiene, poly-1,4-hexadiene and poly-1,5-hexadiene; an α,β-unsaturated aldehyde polymer; an α,β-unsaturated ketone polymer such as poly(methyl vinyl ketone), poly(aromatic vinyl ketone) and poly(cyclic vinyl ketone); a polymer of an α,β-unsaturated carboxylic acid and derivative thereof such as (meth)acrylic acid, α-chloroacrylic acid, a (meth)acrylic acid salt, a (meth)acrylic acid ester and a halogenated(meth)acrylic acid; a polymer of an α,β-unsaturated carboxylic anhydride such as poly(meth)acrylic anhydride and a copolymer of maleic anhydride; a polymers of an unsaturated polybasic carboxylate such as methylene malonic acid diester and itaconic acid diester; a polymer of a diolefin carboxylate such as sorbate and muconate; a polymer of an α,β-unsaturated carboxylic acid thioester such as a (meth) acrylic acid thioester, α-chloroacrylic acid thioester; a polymer of (meth)acrylonitrile and derivative thereof such as (meth)acrylonitrile and α-chloroacrylonitrile; a polymer of (meth)acrylamide and derivative thereof such as (meth)acrylamide and N,N-dimethyl (meth)acrylamide; a polymer of a styryl metallic compound; a polymer of a vinyloxy metallic compound; a polyimine; a polyether such as polyphenylene oxide, poly-1,3-dioxolane, polyoxirane, polytetrahydrofuran and polytetrahydropyran; a polysulfide; a polysulfoneamide; a polypeptide; a polyamide such as nylon 66 and nylon 1 to nylon 12; a polyester such as an aliphatic polyester, an aromatic polyester, an alicyclic polyester and a polycarbonate; a polyurea; a polysulfone; a polyazine; a polyamine; a polyaromatic ketone; a polyimide; a polybenzimidazole; a polybenzoxazole; a polybenzothiazole; a polyaminotriazole; a polyoxadiazole; a polypyrazole; a polytetrazole; a polyquinoxaline; a polytriazine; a polybenzoxadinone; a polyquinoline; a polyanthrazoline and the like.

The above-mentioned thermoset resin is a component having a function of becoming insoluble in a solvent when hardened by heating and of preventing intermixing between the resist under layer film and a resist film formed on the resist under layer film. Examples of the thermoset resin include a thermoset acryl-based resin, a phenol resin, a urea resin, a melamine resin, an amino-based resin, an aromatic hydrocarbon resin, an epoxy resin, an alkyd resin and the like. Of these a urea resin, a melamine resin and an aromatic hydrocarbon resin are preferable.

The binder resin may be used singly or in combination of two or more types thereof.

The compounding amount of the binder resin is usually not more than 20 parts by weight and preferably in the range from 1 to 10 parts by weight based on 100 parts by weight of the compound (A).

Examples of the above-mentioned radiation absorber include a dye such as an oil soluble dye, a disperse dye, a basic dye, a methane-based dye, a pyrazole-based dye, an imidazole-based dye and a hydroxyazo-based dye; a fluorescent brightening agent such as a bixin derivative, a norbixin, a stilbene, a 4,4'-diaminostilbene derivative, a cumarin derivative, and a pyrazoline derivative; a UV absorber such as a hydroxyazo-based dye, and "Cinubin 234" and "Cinubin 1130" (manufactured by Ciba Geigy Corp.); an aromatic compound such as an anthracene derivative and an anthraquinone derivative; and the like. The above-mentioned radiation absorber may be used singly or in combination of two or more types thereof.

The compounding amount of the radiation absorber is usually not more than 100 parts by weight and preferably in the range from 1 to 50 parts by weight based on 100 parts by weight of the compound (A).

The above-mentioned surfactant is a component having an effect of improving coatability, striation, wettability, developability and the like. Examples of the surfactant include a nonionic surfactant such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate and polyethylene distearate, a commercially available product such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF101", "EFTOP EF204", "EFTOP EF303" and "EFTOP EF352" (manufactured by JEMCO, Inc.), "MEGAFAC F171", "MEGAFAC F172" and "MEGAFAC F173" (manufactured by Dainippon Ink and Chemicals, Inc.), "Fluorad FC430", "Fluorad FC431", "Fluorad FC135" and "Fluorad FC93" (manufactured by Sumitomo 3M Ltd.), "Asahi Guard AG710", "Surflon S382", "Surflon SC101", "Surflon SC102", "Surflon SC103", "Surflon SC104", "Surflon SC105" and "Surflon SC106" (manufactured by Asahi Glass Co., Ltd.), and the like. The surfactant may be used singly or in combination of two or more types thereof.

The compounding amount of the surfactants is usually not more than 15 parts by weight and preferably in the range from 0.001 to 10 parts by weight based on 100 parts by weight of the compound (A).

In addition to the above-mentioned additives (F), other additives such as a preservative, anti-foaming agent and an adhesion adjuvant can be added to the composition for forming a resist under layer film of the present invention.

[1-2] Film-Forming Process

The film-forming process is a process in which the coating film obtained from the above-mentioned composition for forming a resist under layer film is subjected to setting under an oxidizing atmosphere to form a resist under layer film.

It is thought that a dehydrogenation reaction occurs by one-electron oxidation of the compound (A) (for instance, one-electron oxidation of the phenolic hydroxyl group possessed by the compound (A)) in the composition for forming a resist under layer film which forms the coating film, whereby the molecular weight of the compound increases in this process.

The above-mentioned film-forming process is usually carried out by heating under oxidizing atmosphere. Oxidizing atmosphere herein refers to a mixed gas (including air) consisting of 1% or more by volume of oxygen and an inert gas, or 100% by volume of oxygen at 23° C. under atmospheric pressure.

Examples of the above-mentioned inert gas include nitrogen, helium, argon, carbon dioxide, steam, mixtures of these gases, and the like. Of these gases, nitrogen is preferable due to its low cost.

The oxygen concentration under the oxidizing atmosphere (23° C., normal pressure) is 1% or more by volume, preferably in the range from 5% to 100% by volume, more preferably from 5% to 70% by volume, and particularly from 10% to 50% by volume. The oxygen concentration of 1% or more by volume is preferable to cause the dehydrogenation reaction to promptly proceed.

The heating temperature in the film-forming process is usually 300° C. or higher (the upper limit is usually not higher than the melting point of the compound (A) used), preferably in the range from 300° C. to 500° C., more preferably from 350° C. to 500° C., and further preferably from 350° C. to 450° C. The heating temperature of 300° C. or higher is preferable to cause the dehydrogenation reaction to promptly proceed.

Additionally, the heating time is not particularly limited, but is preferably in the range from 10 to 900 seconds, more preferably from 30 to 600 seconds, and further preferably from 60 to 300 seconds.

In the film-forming process, the coating film may be preheated at a temperature in the range from 100° C. to 250° C., and preferably from 150° C. to 250° C. before heating at the temperature of 300° C. or higher.

Although not particularly limited, the heating time is preferably in the range from 10 to 300 seconds, and more preferably from 30 to 120 seconds.

Preheating causes the solvent to previously vaporize and makes the film become denser, whereby the dehydrogenation reaction can efficiently proceed.

In addition, the dehydrogenation rate of the resist under layer film in the film-forming process, which is the difference in the hydrogen content before and after dehydrogenation, that is, the rate of decrease of the hydrogen content after dehydrogenation from the hydrogen content before dehydrogenation, is preferably 10% or more, more preferably 15% or more, and still more preferably 20% or more.

The method of measuring the dehydrogenation rate is the same as that in Examples described later.

In the method of forming the resist under layer film of the present invention, the coating film is usually hardened in the above-mentioned film-forming process to produce a resist under layer film. However, it is possible to add a specified photocuring agent (crosslinking agent) to the above-mentioned composition for forming a resist under layer film and to form the resist under layer film in an exposing process which is provided after the film-forming process. The type of radiation used for exposure is appropriately selected according to the type of photoacid generator added to the composition for forming a resist under layer film from visible rays, ultraviolet rays, deep ultraviolet rays, X-rays, electron beams, γ-rays, molecular beams, ion beams, and the like.

Furthermore, in the method of forming a resist under layer film of the present invention, it is possible to add a specified thermosetting agent and/or photocuring agent (crosslinking agent) to the above-mentioned composition for forming a resist under layer film to crosslink a portion of the compound (A) in the coating film in a crosslinking process which comprises exposing and/or heating operation provided after the above-mentioned film-forming process.

[2] Pattern-Forming Method

The pattern forming method of the present invention is characterized by comprising a process for forming a resist under layer film on a substrate by the above-mentioned method for forming a resist under layer film (hereinafter referred to as "process (1)"), a process for forming a resist film on the above-mentioned resist under layer film using a resist composition solution (hereinafter referred to as "process (2)"), a process for exposing necessary parts of the above-mentioned resist film to radiation (hereinafter referred to as "process (3)"), a process for forming a resist pattern by developing an irradiated resist film (hereinafter referred to as "process (4)"), and a process for processing the above-mentioned resist under layer film and the above-mentioned substrate using the above-mentioned resist pattern as a mask by a dry-etching method (hereinafter referred to as "process (5)").

In the above-mentioned process (1), a resist under layer film is formed on a substrate using the above-mentioned method for forming a resist under layer film. The above description can be applied as is to the method of forming the resist under layer film.

The thickness of the resist under layer film formed in the process (1) is usually in the range from 0.1 to 5 μm.

In addition, the pattern forming method of the present invention may further comprise a process (1') of forming an intermediate layer on the resist under layer film after the process (1) as required.

The intermediate layer is a layer for reinforcing the functions possessed by the resist under layer film and/or the resist film or for providing the functions with the resist under layer film and/or the resist film which are not possessed by these films. In the case where an antireflection film is, for instance, formed as the intermediate layer, the intermediate film can reinforce the antireflecting function of the resist under layer film.

The intermediate layer may be formed from an organic compound or an inorganic oxide. Examples of the organic compound include materials commercially available under the trade names of "DUV-42", "DUV-44", "ARC-28", "ARC-29" and the like manufactured by Brewer Science, Inc., and "AR-3", "AR-19" and the like manufactured by Lohm and Haas Company, and the like. Examples of the inorganic oxide include materials commercially available under the trade names of "NFC SOG01", "NFC SOG04" and the like manufactured by JSR Corp., and polysiloxane, titanium oxide, alumina, tungsten oxide, and the like formed by the CVD method.

The method of forming the intermediate layer is not particularly limited, but a coating method, a CVD method or the like can be used. Of these, the coating method is preferable. When the coating method is used, the intermediate layer may be formed continuously after forming the resist under layer film.

Additionally, the thickness of the intermediate layer is not particularly limited and is appropriately selected according to the demanded functions. It is preferably in the range from 10 to 3,000 nm, and more preferably from 20 to 300 nm. If the thickness of the intermediate layer is less than 10 nm, there may be a case in which the intermediate layer is etched and lost during etching of the resist under layer film. If the thickness exceeds 3,000 nm, the processing transformation difference is remarkable when transferring the resist pattern to the intermediate layer.

In the above-mentioned process (2), a resist under layer film is formed on the resist under layer film and/or the intermediate layer using the resist composition solution.

Specifically, after applying the resist composition solution in an amount to obtain a resist film having a prescribed thickness, the resist film can be formed by prebaking the coating film to volatilize the solvent in the coating film.

Examples of the above-mentioned resist composition solution include a positive-type or negative-type chemically amplified resist composition containing a photoacid generator, a positive-type resist composition comprising an alkali-soluble resin and a quinondiazido-based sensitizer, a negative-type resist composition comprising an alkali-soluble resin and a crosslinking agent, and the like. Additionally, the solid content of the resist composition solution applied to the resist under layer film or the intermediate layer is usually in the range from about 5% to 50% by weight. The resist composition solution obtained by filtering through a filter with a pore diameter of about 0.2 μm is usually used. A commercially available product of the resist composition solution may be used as is.

The method of coating of the resist composition solution is not particularly limited. The spin coating method and the like may be used.

Additionally, the prebaking temperature is appropriately adjusted according to the type and the like of the resist composition solution used, but is usually in the range from about 30° C. to 200° C., and preferably from 50° C. to 150° C.

In the above-mentioned process (3), desired areas of the resist film are selectively exposed to radiation through a photomask.

Radiation used for exposure is appropriately selected according to the type of the photoacid generator used in the resist composition from among visible rays, ultraviolet rays, deep ultraviolet rays, X-rays, electron beams, γ-rays, molecular beams, ion beams, and the like. Of these types of radiation, use of deep ultraviolet rays, particularly a KrF excimer laser (wavelength: 248 nm), an ArF excimer laser (wavelength: 193 nm), a $F_2$ excimer laser (wavelength: 157 nm), a $Kr_2$ excimer laser (wavelength: 147 nm), an ArKr excimer laser (wavelength: 134 nm), extreme ultraviolet rays (wavelength: 13 nm) and the like are preferable.

In the above-mentioned process (4), the resist film after exposure is developed using a developer to form a resist pattern.

The developer used in this process is appropriately selected according to the type of the resist composition. For example, an alkaline aqueous solution of sodium hydroxide, potassium hydroxide, sodium carbonate, sodium silicate, sodium metasilicate, ammonia, ethyl amine, n-propyl amine, diethyl amine, di-n-propyl amine, triethyl amine, methyldiethyl amine, dimethyl ethanol amine, triethanol amine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene or the like can given. An appropriate amount of an aqueous organic solvent, alcohol such as methanol and ethanol, and a surfactant can be optionally added to the alkaline aqueous solution.

Further, the resist film after developing is washed and dried to form a desired resist pattern.

In this process, it is preferable to postbake the resist film after exposure, but before development, in order to improve resolution, a pattern profile, developability, and the like. The temperature of postbaking is appropriately adjusted according to the type and the like of the resist composition used and is in the range usually from 50° C. to 200° C., and preferably from 80° C. to 150° C.

In the above-mentioned process (5), the pattern is transferred to the intermediate layer and/or resist under layer film by dry-etching of the resist under layer film using gas plasma such as oxygen plasma utilizing the above-mentioned resist pattern as a mask.

According to the pattern forming method of the present invention, a pattern for processing a prescribed substrate can be formed by appropriately performing the processes (1) to (5).

EXAMPLES

Hereinafter, the present invention will be described in greater detail by referring to the following Examples. The present invention is in no way limited by these Examples. In addition, "part" and "%" are based on weight unless otherwise indicated.

[1] Preparation of Compound (A)

Synthesis Example 1

A reactor equipped with a condenser, a thermometer and a stirrer was charged with 100 parts of 2,7-dihydroxynaphthalene, 100 parts of propylene glycol monomethyl ether acetate and 50 parts of paraformaldehyde. After the addition of 2 parts of oxalic acid, the mixture was heated to 120° C. while dehydrating and was reacted for five hours to obtain a polymer having the following structure (Mw=1,500). This polymer is referred to as "compound (A-1)".

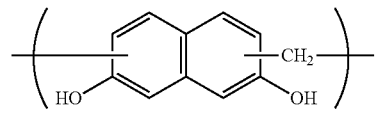

Synthesis Example 2

A reactor equipped with a condenser, a thermometer and a stirrer was charged with 100 parts of phenol, 100 parts of propylene glycol monomethyl ether acetate and 50 parts of paraformaldehyde. After the addition of 2 parts of oxalic acid, the mixture was heated to 120° C. while dehydrating and was reacted for five hours to obtain a polymer having the following structure (Mw=1,300). This polymer is referred to as "compound (A-2)".

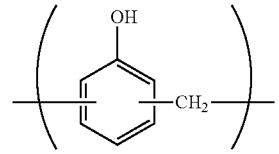

Synthesis Example 3

A reactor equipped with a condenser, a thermometer and a stirrer was charged with 100 parts of 2,7-dihydroxynaphthalene, 100 parts of propylene glycol monomethyl ether acetate, 30 parts of paraformaldehyde and 20 parts of furfurylaldehyde. After the addition of 2 parts of oxalic acid, the mixture was heated to 120° C. while dehydrating and was reacted for five hours to obtain a polymer having the following structure (Mw=1,600). This polymer is referred to as "compound (A-3)".

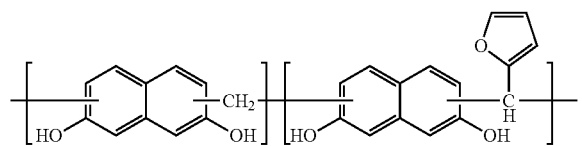

Synthesis Example 4

A reactor equipped with a condenser, a thermometer and a stirrer was charged with 100 parts of resorcinol and 200 parts of ethanol, and then 68 parts of hydrochloric acid was added to the mixture. The resulting solution was cooled with ice to 5° C. while stirring and 45 parts of an aqueous solution of 50% 1,5-pentanedial was slowly added dropwise. After the addition, the mixture was heated at 80° C. for 48 hours to obtain a cloudy yellow suspension. The suspension was poured into methanol, and the resulting precipitate was collected by filtration. The precipitate was washed three times with methanol. The washed precipitate was dried under reduced pressure at room temperature for 24 hours to obtain a powdery light yellow solid. Then, 23 parts of tetrabutylammonium bromide and 350 parts of dehydrated pyridine were added to 100 parts of the resulting light yellow solid and the mixture was stirred for one hour. Subsequently, 185 parts of di-t-butyl dicarbonate was gradually added and the mixture was stirred at room temperature for 48 hours. After the reaction, the reaction mixture was cooled to room temperature and poured into 300 ml of a 3% oxalic acid aqueous solution to precipitate a solid. The resulting solid was dissolved in methylene chloride and the solution was washed three times with 100 ml of a 3% oxalic acid aqueous solution and two times with 100 ml of water. After discharging the water layer, the organic layer was dried using magnesium sulfate and was purified by a silica gel column using a 1:1 (volume ratio) mixture of hexane and ethyl acetate to obtain a compound (A-4) having the following structure.

As a result of $^1$H-NMR analysis of the compound (A-4), it was found that 50% by mol of all Rs was a group (t-butoxycarbonyl group) shown by the following formula (R-1) with the remaining R being hydrogen atom.

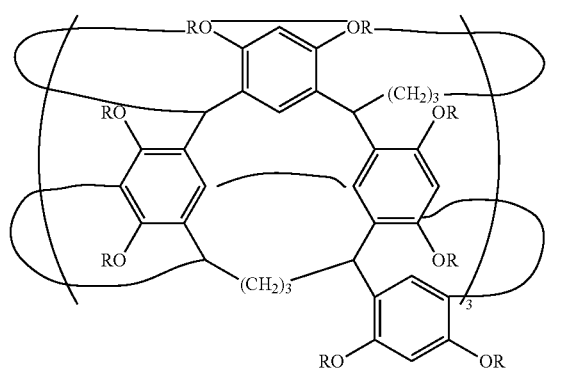

(A-4)

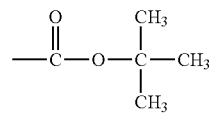

(R-1)

Synthesis Example 5

A separable flask equipped with a thermometer was charged with 100 parts of acenaphthylene, 78 parts of toluene, 52 parts of dioxane and 3 parts of azobisisobutyronitrile under a nitrogen atmosphere and the mixture was stirred at 70° C. for five hours. After that, 5.2 parts of p-toluenesulfonic acid mono-hydrate and 40 parts of paraformaldehyde were added, and the mixture was heated to 120° C. and stirred for a further 6 hours. Subsequently, the reaction solution was poured into a large amount of isopropanol and the precipitated resin was filtered to obtain a polymer having the following structure (Mw=20,000). This polymer is referred to as "compound (A-5)".

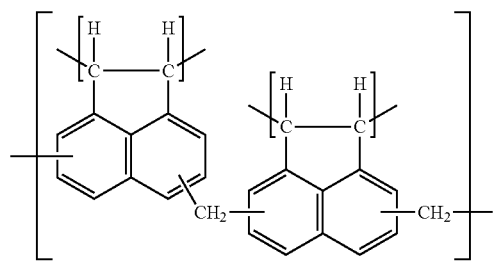

The weight average molecular weight (Mw) of the compounds (A) obtained in Synthesis Examples was measured by gel permeation chromatography (detector: refractive index detector) utilizing monodisperse polystyrene as a standard and using GPC columns (manufactured by Tosoh Corp., "G2000HXL"×2, "G3000HXL"×1) at a flow rate of 1.0 ml/minute, using tetrahydrofuran as an eluate, at a column temperature of 40° C.

1H-NMR analysis of the compounds (A) was carried out using "JNM-ECA-500" manufactured by JEOL Ltd. and DMSO-$d_6$ as a solvent.

[2] Preparation of Composition for Forming Resist Under Layer Film

Synthesis Example 6

10 parts of the compound (A-1) was dissolved in 90 parts of propylene glycol monomethyl ether acetate (solvent). The solution was filtered through a membrane filter with a pore size of 0.1 μm to prepare a composition (I) for forming resist under layer film.

Synthesis Example 7

10 parts of the compound (A-2) was dissolved in 90 parts of propylene glycol monomethyl ether acetate (solvent). The solution was filtered through a membrane filter with a pore size of 0.1 μm to prepare a composition (II) for forming resist under layer film.

Synthesis Example 8

10 parts of the compound (A-3) was dissolved in 90 parts of propylene glycol monomethyl ether acetate (solvent). The solution was filtered through a membrane filter with a pore size of 0.1 μm to prepare a composition (III) for forming resist under layer film.

Synthesis Example 9

10 parts of the compound (A-4) was dissolved in 65 parts of cyclohexanone (solvent) and 25 parts of γ-butyrolactone (solvent). The solution was filtered through a membrane filter with a pore size of 0.1 μm to prepare a composition (IV) for forming resist under layer film.

Synthesis Example 10

10 parts of the compound (A-1) and 1.0 part of t-butyl hydroperoxide as a one-electron oxidizer (accelerator (C-1)) were dissolved in 89 parts of propylene glycol monomethyl ether acetate (solvent). The solution was filtered through a membrane filter with a pore size of 0.1 μm to prepare a composition (V) for forming resist under layer film.

Synthesis Example 11

10 parts of the compound (A-2) and 1.0 part of t-butyl hydroperoxide as a one-electron oxidizer (accelerator (C-1)) were dissolved in 89 parts of propylene glycol monomethyl ether acetate (solvent). The solution was filtered through a membrane filter with a pore size of 0.1 μm to prepare a composition (VI) for forming resist under layer film.

Synthesis Example 12

10 parts of the compound (A-3) and 1.0 part of t-butyl hydroperoxide as a one-electron oxidizer (accelerator (C-1)) were dissolved in 89 parts of propylene glycol monomethyl ether acetate (solvent). The solution was filtered through a membrane filter with a pore size of 0.1 μm to prepare a composition (VII) for forming resist under layer film.

Synthesis Example 13

10 parts of the compound (A-5), 0.5 part of bis(4-t-butylphenyl)iodonium 10-camphorsulfonate, and 0.5 part of 4,4'-[1-{4-(1-[4-hydroxyphenyl]-1-methylethyl)phenyl}ethylidene]bisphenol were dissolved in 89 parts of cyclohexanone (solvent). The solution was filtered through a membrane filter with a pore size of 0.1 μm to prepare a composition (VIII) for forming resist under layer film.

[3] Preparation of Resist Composition Solution for ArF

In order to evaluate the performance of the resist under layer film prepared from the compositions for forming a under layer film, a positive-type resist composition solution for ArF was prepared.

A separable flask equipped with a reflux condenser was charged with 29 parts of 8-methyl-8-t-butoxycarbonylmethoxycarbonyltetracyclo[4.4.0.1$^{2,5}$.1$^{7,10}$] dodec-3-ene (monomer (α)), 10 parts of 8-methyl-8-hydroxytetracyclo[4.4.0.1$^{2,5}$.1$^{7,10}$]dodec-3-ene (monomer (β)), 18 parts of maleic anhydride (monomer (γ)), 4 parts of 2,5-dimethyl-2,5-hexanediol diacrylate, 1 part of t-dodecyl mercaptan, 4 parts of azobisisobutyronitrile and 60 parts of 1,2-diethoxyethane, and then polymerization was carried out at 70° C. for six hours while stirring. After the reaction, the reaction mixture was poured into a large amount of a mixed solvent of n-hexane and i-propyl alcohol (weight ratio: 1:1) to solidify the resin. The solidified resin was washed several times with the mixed solvent, dried under vacuum to obtain a resin containing repeating units (a), (b), and (c), each having the following structure, each of which respectively originating from the above-mentioned monomers (α), (β), and (γ) (yield: 60%). The molar ratio of the repeating units (a), (b) and (c) for the resin was 64:18:18 and Mw was 27,000. The molecular weight (Mw) of the resin was measured using the same method as that used for measuring Mw of the compound (A) obtained in [1] above.

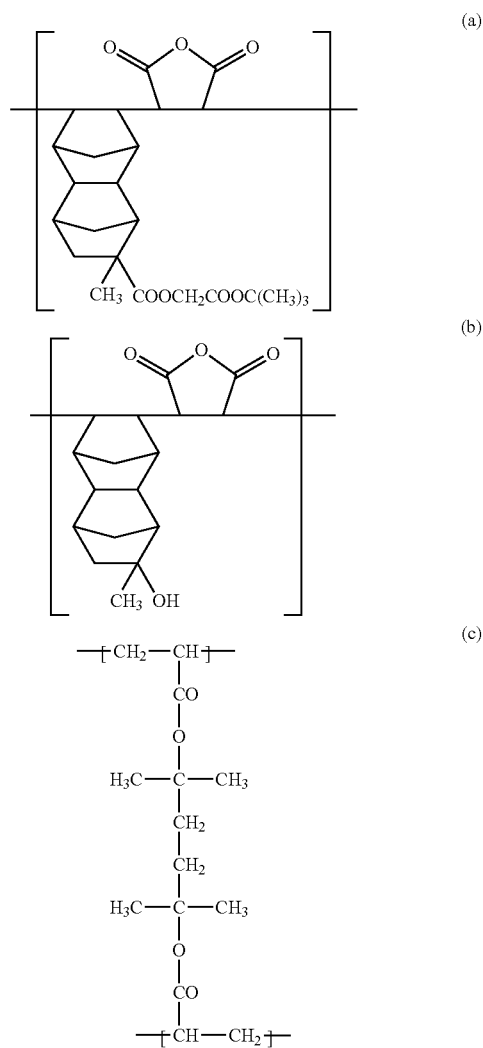

After that, 80 parts of the above resin, 1.5 parts of 1-(4-methoxynaphthalen-1-yl)tetrahydrothiophenium nonafluoro-n-butanesulfonate and 0.04 part of tri-n-octylamine were dissolved in 533 parts of propylene glycol monomethyl ether acetate to obtain a resist composition solution for ArF.

[4] Formation of Resist Under Layer Film

Example 1

A resist under layer film having a thickness of 0.3 μm for Example 1 was formed by applying the composition (I) for forming resist under layer film on a silicon wafer with a diameter of 8 inches by spin coating and heating on a hot plate with an oxygen concentration of 20% by volume at 180° C. for 60 seconds and at 350° C. for 120 seconds, sequentially.

Examples 2 to 27

Resist under layer films having a thickness of 0.3 μm for Examples 2 to 27 were formed by applying the compositions shown in Table 1 to silicon wafers with a diameter of 8 inches by spin coating and heating on a hot plate with an oxygen concentration shown in Table 1 at 180° C. for 60 seconds and under the conditions (temperature and time) shown in Table 1, sequentially.

Comparative Examples 1 to 16

Resist under layer films having a thickness of 0.3 μm for Comparative Examples 1 to 16 were formed by applying the compositions shown in Table 2 to silicon wafers with a diameter of 8 inches by spin coating and heating on a hot plate with an oxygen concentration shown in Table 2 at 180° C. for 60 seconds and under the conditions (temperature and time) shown in Table 2, sequentially.

TABLE 1

|  |  | Under layer film composition | Composition Compound (A) | Composition Accelerator (C) | Conditions of under layer film formation Temperature (° C.) | Conditions of under layer film formation Time (second) | Conditions of under layer film formation Oxygen content (vol %) |
|---|---|---|---|---|---|---|---|
| Example | 1 | Composition (I) | A-1 | — | 350 | 120 | 20 |
|  | 2 | Composition (II) | A-2 | — | 350 | 120 | 20 |
|  | 3 | Composition (III) | A-3 | — | 350 | 120 | 20 |
|  | 4 | Composition (IV) | A-4 | — | 350 | 120 | 20 |
|  | 5 | Composition (V) | A-1 | C-1 | 350 | 120 | 20 |
|  | 6 | Composition (VI) | A-2 | C-1 | 350 | 120 | 20 |
|  | 7 | Composition (VII) | A-3 | C-1 | 350 | 120 | 20 |
|  | 8 | Composition (I) | A-1 | — | 300 | 120 | 20 |
|  | 9 | Composition (II) | A-2 | — | 300 | 120 | 20 |
|  | 10 | Composition (III) | A-3 | — | 300 | 120 | 20 |
|  | 11 | Composition (V) | A-1 | C-1 | 300 | 120 | 20 |
|  | 12 | Composition (VI) | A-2 | C-1 | 300 | 120 | 20 |
|  | 13 | Composition (VII) | A-3 | C-1 | 300 | 120 | 20 |
|  | 14 | Composition (I) | A-1 | — | 350 | 60 | 20 |
|  | 15 | Composition (II) | A-2 | — | 350 | 60 | 20 |
|  | 16 | Composition (III) | A-3 | — | 350 | 60 | 20 |
|  | 17 | Composition (V) | A-1 | C-1 | 350 | 60 | 20 |
|  | 18 | Composition (VI) | A-2 | C-1 | 350 | 60 | 20 |
|  | 19 | Composition (VII) | A-3 | C-1 | 300 | 60 | 20 |
|  | 20 | Composition (I) | A-1 | — | 450 | 120 | 20 |
|  | 21 | Composition (II) | A-2 | — | 450 | 120 | 20 |
|  | 22 | Composition (III) | A-3 | — | 450 | 120 | 20 |
|  | 23 | Composition (I) | A-1 | — | 350 | 120 | 30 |
|  | 24 | Composition (II) | A-2 | — | 350 | 120 | 30 |
|  | 25 | Composition (III) | A-3 | — | 350 | 120 | 30 |
|  | 26 | Composition (I) | A-1 | — | 350 | 120 | 10 |
|  | 27 | Composition (I) | A-1 | — | 350 | 120 | 5 |

TABLE 2

|  |  | Under layer film composition | Composition Compound (A) | Composition Accelerator (C) | Conditions of under layer film formation Temperature (° C.) | Conditions of under layer film formation Time (second) | Conditions of under layer film formation Oxygen content (vol %) |
|---|---|---|---|---|---|---|---|
| Comparative Example | 1 | Composition (I) | A-1 | — | 350 | 120 | 0.1 |
|  | 2 | Composition (II) | A-2 | — | 350 | 120 | 0.1 |
|  | 3 | Composition (III) | A-3 | — | 350 | 120 | 0.1 |
|  | 4 | Composition (IV) | A-4 | — | 350 | 120 | 0.1 |
|  | 5 | Composition (V) | A-1 | C-1 | 350 | 120 | 0.1 |
|  | 6 | Composition (VI) | A-2 | C-1 | 350 | 120 | 0.1 |
|  | 7 | Composition (VII) | A-3 | C-1 | 350 | 120 | 0.1 |
|  | 8 | Composition (I) | A-1 | — | 450 | 600 | 0.1 |
|  | 9 | Composition (II) | A-2 | — | 450 | 600 | 0.1 |
|  | 10 | Composition (III) | A-3 | — | 450 | 600 | 0.1 |
|  | 11 | Composition (V) | A-1 | C-1 | 450 | 600 | 0.1 |
|  | 12 | Composition (VI) | A-2 | C-1 | 450 | 600 | 0.1 |
|  | 13 | Composition (VII) | A-3 | C-1 | 450 | 600 | 0.1 |
|  | 14 | Composition (VIII) | A-5 | — | 350 | 120 | 20 |
|  | 15 | Composition (VIII) | A-5 | — | 450 | 120 | 20 |
|  | 16 | Composition (VIII) | A-5 | — | 350 | 120 | 30 |

The resist under layer films of Examples 1 to 27 and Comparative Example 1 to 16 were evaluated for the following items. The results are shown in Tables 3 and 4.

[5-1] Measurement of Hydrogen Content before and after Dehydrogenation and Measurement of Dehydrogenation Rate <Hydrogen Content after Dehydrogenation>

In the resist under layer films of Examples 1 to 27 and Comparative Example 1 to 16, the weight reduction of carbon, hydrogen and nitrogen was determined using micro corder "JM10" (manufactured by J-SCIENCE LAB CO., Ltd.). The number of atoms of each element contained in the film was calculated by the formula [weight-reduced value of each element (% by weight)/weight (gram) of each element], following which the hydrogen content (atom %) after dehydrogenation was determined by the formula [number of hydrogen atoms in the film/number of all atoms in the film].

<Hydrogen Content before Dehydrogenation>

Each of the compositions (I) to (VIII) for forming resist under layer film prepared in [2] above was applied to a silicon wafer having a diameter of 8 inches by spin coating and was heated on a hot plate with an oxygen concentration of 20% by volume at 180° C. for 60 seconds to obtain a film. The film was subjected to determination in the same manner as those determined for the above resist under layer films and the value was used as the hydrogen content before dehydrogenation.

<Dehydrogenation Rate>

The rate of the hydrogen content decrease was determined from the hydrogen content before dehydrogenation and the hydrogen content after dehydrogenation.

[5-2] Pattern Form after Substrate Processing (Evaluation of Pattern Transfer Performance)

Each of the intermediate layer films having a thickness of 0.05 μm was formed by applying the solution composition for forming an intermediate layer for three-layer resist processing (trade name "NFC SOG080" manufactured by JSR Corp.) to the resist under layer films formed in Examples 1 to 27 and Comparative Examples 1 to 16 by spin coating and heating the coating film for 60 seconds on a hot plate at 200° C. and for 60 seconds on a hot plate at 300° C., sequentially. After that, each of the resist films having a thickness of 0.2 μm was formed by applying the solution compositions for forming a resist film for ArF prepared in [3] above by spin coating and prebaking the coating film for 90 seconds on a hot plate at 130° C. The resulting resist film was exposed to radiation through a mask pattern using an ArF excimer laser photolithography apparatus (manufactured by Nikon Corp., lens numerical aperture: 0.78, wavelength: 193 nm) for an optimum dose exposure time. The film was then postbaked on a hot plate at 130° C. for 90 seconds. Subsequently, an aqueous solution of 2.38% of tetramethylammonium hydroxide was used for development at 25° C. for one minute, washing was carried out with water, and drying was carried out to obtain an ArF positive-type resist pattern. The intermediate film was processed using this resist pattern as a mask and the resist under layer film was processed using the resulting intermediate film as a mask. After that, the substrate was processed using the resulting resist under layer film as a mask.

The pattern formed in this manner was observed using a scanning electron microscope (SEM) to evaluate according to the following criteria.

○: pattern of the resist under layer film was standing.

×: pattern of the resist under layer film was fallen or curved.

[5-3] Etching Resistivity

Each of the resist under layer films obtained in Examples 1 to 27 and Comparative Examples 1 to 16 was subjected to an etching process using an etching device ("EXAM" manufactured by Sinko Seiki Co., Ltd.) in $CF_4/Ar/O_2$ ($CF_4$: 40 ml/min, Ar: 20 ml/min, $O_2$: 5 ml/min; pressure: 20 Pa; RF power: 200 W; processing time: 40 seconds; temperature: 15° C.). The thicknesses before and after etching were measured to determine the etching rate, whereby the etching resistivity was evaluated. The following criteria for evaluation were applied.

○: etching rate was 150 nm/min or less.

Δ: etching rate was more than 150 nm/min, but less than 200 nm/min.

×: etching rate was 200 nm/min or more.

TABLE 3

| | | Hydrogen content (atom %) | | | | |
|---|---|---|---|---|---|---|
| | | Before dehydrogenation | After dehydrogenation | Dehydrogenation rate (%) | Pattern form | Etching resistivity |
| Example | 1 | 38.0 | 24.6 | 35.3 | ○ | ○ |
| | 2 | 42.8 | 33.8 | 21.0 | ○ | Δ |
| | 3 | 37.8 | 24.4 | 35.4 | ○ | ○ |
| | 4 | 43.2 | 29.2 | 32.4 | ○ | Δ |
| | 5 | 38.3 | 24.0 | 37.3 | ○ | ○ |
| | 6 | 43.2 | 33.5 | 22.5 | ○ | Δ |
| | 7 | 38.1 | 24.1 | 36.7 | ○ | ○ |
| | 8 | 38.0 | 24.2 | 36.3 | ○ | ○ |
| | 9 | 42.8 | 33.8 | 21.0 | ○ | Δ |
| | 10 | 37.8 | 24.6 | 34.9 | ○ | ○ |
| | 11 | 38.3 | 24.3 | 36.6 | ○ | ○ |
| | 12 | 43.2 | 33.2 | 23.1 | ○ | Δ |
| | 13 | 38.1 | 24.3 | 36.2 | ○ | ○ |
| | 14 | 38.0 | 23.8 | 37.4 | ○ | ○ |
| | 15 | 42.8 | 33.4 | 22.0 | ○ | Δ |
| | 16 | 37.8 | 23.9 | 36.8 | ○ | ○ |
| | 17 | 38.3 | 24.0 | 37.3 | ○ | ○ |
| | 18 | 43.2 | 33.5 | 22.5 | ○ | Δ |
| | 19 | 38.1 | 23.8 | 37.5 | ○ | ○ |
| | 20 | 38.0 | 23.9 | 37.1 | ○ | ○ |
| | 21 | 42.8 | 33.7 | 21.3 | ○ | Δ |
| | 22 | 37.8 | 24.0 | 36.5 | ○ | ○ |
| | 23 | 38.0 | 23.7 | 37.6 | ○ | ○ |
| | 24 | 42.8 | 25.5 | 40.4 | ○ | Δ |
| | 25 | 38.1 | 23.9 | 37.3 | ○ | ○ |

TABLE 3-continued

| | | Hydrogen content (atom %) | | | |
| | | Before dehydrogenation | After dehydrogenation | Dehydrogenation rate (%) | Pattern form | Etching resistivity |
| --- | --- | --- | --- | --- | --- | --- |
| | 26 | 38.0 | 28.8 | 24.2 | ○ | ○ |
| | 27 | 38.0 | 33.5 | 11.8 | ○ | ○ |

TABLE 4

| | | Hydrogen content (atom %) | | | | |
| | | Before dehydrogenation | After dehydrogenation | Dehydrogenation rate (%) | Pattern form | Etching resistivity |
| --- | --- | --- | --- | --- | --- | --- |
| Comparative Example | 1 | 38.0 | 37.5 | 1.3 | X | ○ |
| | 2 | 42.8 | 41.2 | 3.7 | X | Δ |
| | 3 | 37.8 | 37.0 | 2.1 | X | Δ |
| | 4 | 43.2 | 41.8 | 3.2 | X | Δ |
| | 5 | 38.3 | 37.7 | 1.6 | X | ○ |
| | 6 | 43.2 | 41.1 | 4.9 | X | Δ |
| | 7 | 38.1 | 37.3 | 2.1 | X | Δ |
| | 8 | 38.0 | 37.1 | 2.4 | X | ○ |
| | 9 | 42.8 | 42.0 | 1.9 | X | Δ |
| | 10 | 37.8 | 36.8 | 2.6 | X | ○ |
| | 11 | 38.3 | 37.7 | 1.6 | X | ○ |
| | 12 | 43.2 | 42.5 | 1.6 | X | Δ |
| | 13 | 38.1 | 36.6 | 3.9 | X | ○ |
| | 14 | 40.9 | 40.0 | 2.2 | X | ○ |
| | 15 | 40.9 | 40.2 | 1.7 | X | ○ |
| | 16 | 40.9 | 40.5 | 1.0 | X | ○ |

[6] Effect of Examples

As is clear from Tables 3 and 4, the resist under layer films of Examples 1 to 27 which were formed in a process including the dehydrogenation step were confirmed to exhibit excellent pattern transfer performance and etching resistivity.

The invention claimed is:

1. A pattern forming method comprising:
   coating a composition to form a resist under layer film on a substrate, said composition comprising a compound having a phenolic hydroxyl group and a solvent;
   setting said composition under an oxidizing atmosphere with an oxygen content of 1% or more by volume and a temperature of 300 ° C. or higher to form a resist under layer film;
   forming an intermediate layer on said resist under layer film, said intermediate layer including an inorganic oxide;
   forming a resist film on said intermediate layer using a resist composition solution;
   exposing necessary parts of the resist film to radiation;
   developing the exposed resist film to form a resist pattern;
   dry-etching said resist under layer film and said intermediate layer using said resist pattern as a mask; and
   dry-etching said substrate using said resist under layer film and said intermediate layer as a mask.

2. The pattern forming method according to claim 1, wherein said composition comprises at least one component selected from the group consisting of (a) a metal compound containing a metal element selected from the group consisting of elements of the groups 3 to 11 and elements of the groups 13 to 15 in the periodic table, (b) a peroxide, (c) a diazo compound, and (d) a halogen or a halogen acid, as an accelerator.

3. The pattern forming method according to claim 2, wherein said peroxide (b) in said accelerator comprises at least one peroxide selected from the group consisting of a peroxy acid, a diacyl peroxide, a peroxy acid ester, a ketal peroxide, a peroxydicarbonate, a dialkyl peroxide, a ketone peroxide and an alkyl hydroxy peroxide.

4. The pattern forming method according to claim 2, wherein said diazo compound (c) in said accelerator comprises 2,2'-azobisisobutylonitrile.

5. The pattern forming method according to claim 2, wherein said metal compound (a) in said accelerator comprises at least one metal compound which contains a metal element selected from the group consisting of cerium, lead, silver, manganese, osmium, ruthenium, vanadium, thallium, copper, iron, bismuth and nickel.

6. The pattern forming method according to claim 2, wherein said halogen or said halogen acid (d) in said accelerator comprises at least one halogen selected from the group consisting of chlorine, bromine and iodine, and at least one compound selected from the group consisting of a perhalogen acid, a halogen acid, a halous acid, a hypohalous acid, and salts of these acids.

* * * * *